United States Patent [19]

Meuris et al.

[11] Patent Number: 5,585,734
[45] Date of Patent: *Dec. 17, 1996

[54] METHOD FOR DETERMINING THE RESISTANCE AND CARRIER PROFILE OF A SEMICONDUCTOR ELEMENT USING A SCANNING PROXIMITY MICROSCOPE

[75] Inventors: Marc A. J. Meuris, Keerbergen; Wilfried B. M. Vandervorst, Mechelen; Peter de Wolf, Eeklo, all of Belgium

[73] Assignee: Interuniversitair Micro Elektronica Centrum VZW, Belgium

[ * ] Notice: The term of this patent shall not extend beyond the expiration date of Pat. No. 5,369,372.

[21] Appl. No.: 345,300

[22] Filed: Nov. 28, 1994

Related U.S. Application Data

[63] Continuation-in-part of Ser. No. 838,419, Mar. 9, 1992, Pat. No. 5,369,372.

[30] Foreign Application Priority Data

Jul. 9, 1990 [EP] European Pat. Off. ............. 90201853
Dec. 13, 1990 [NL] Netherlands ........................... 9002749

[51] Int. Cl.⁶ .................................................. G01R 27/08
[52] U.S. Cl. ......................... 324/719; 324/724; 324/754; 324/715; 250/306
[58] Field of Search .................................. 324/715, 717, 324/718, 719, 722, 724, 754, 756, 757, 758, 765; 250/306

[56] References Cited

U.S. PATENT DOCUMENTS

| | | | |
|---|---|---|---|
| 3,487,301 | 12/1969 | Gardner et al. | 324/719 X |
| 3,590,372 | 6/1971 | DeSantis et al. | 324/715 |
| 4,943,720 | 7/1990 | Jones | 324/754 X |
| 4,992,728 | 2/1991 | McCord et al. | 324/764 |
| 5,023,561 | 6/1991 | Hillard | 324/719 |
| 5,214,389 | 5/1993 | Cao et al. | 324/719 |
| 5,369,372 | 11/1994 | Vander vorst et al. | 324/719 |

FOREIGN PATENT DOCUMENTS

| | | | |
|---|---|---|---|
| 0060869 | 5/1980 | Japan | 324/719 |
| 0048767 | 3/1986 | Japan | 324/719 |
| 4006844 | 1/1992 | Japan | 324/719 |

*Primary Examiner*—Kenneth A. Wieder
*Assistant Examiner*—Diep Do
*Attorney, Agent, or Firm*—Ostrolenk, Faber, Gerb & Soffen, LLP

[57] ABSTRACT

A method for measuring the resistance or conductivity between two or more conductors which are placed against a semiconductor element, the conductors are placed either in contact with the top surface or one conductor is placed in contact with the top surface and the other conductor is in the form of a large ohmic contact applied to the bottom surface of the semiconductor element. In order to bring the contact resistance between the top conductor(s) and the element to, and hold it at, a predetermined value during measuring, the conductor(s) are held at a constant distance and/or under constant pressure relative to the semiconductor element by use of a scanning proximity microscope. The top conductor may have a boron implanted diamond tip. The carrier profile of the semiconductor element is determined from previously derived calibration curves.

31 Claims, 8 Drawing Sheets

5,585,734

METHOD FOR DETERMINING THE RESISTANCE AND CARRIER PROFILE OF A SEMICONDUCTOR ELEMENT USING A SCANNING PROXIMITY MICROSCOPE

CROSS-REFERENCE TO RELATED APPLICATIONS

This application is a continuation-in-part of U.S. Ser. No. 07/838,419, filed Mar. 9, 1992, now U.S. Pat. No. 5,369,372 entitled "Method for Resistance Measurements on a Semiconductor Element".

BACKGROUND OF THE INVENTION

In the design of semiconductor devices it is necessary to determine the in-depth and lateral dopant/carrier profiles of the semiconductor element. This profiling is generally accomplished by measuring the resistance or resistivity of the semiconductor element. A known technique for measurement of resistance on a semiconductor element is called a Spreading Resistance Probe (SRP). A semiconductor element is herein cut obliquely and the resistance between in each case two probe points placed on the surface is measured. These probe points or conductors are placed at an interval of approximately 15 to 50 µm. The angle of inclination is in the region of several minutes to several degrees. The conductors are stepped over the obliquely cut portions with a step size in each case of 2.5 to 5 µm. In the SRP technique the resistance measurement can take place with both direct voltage and alternating voltage.

A problem here is the deviation in the contact resistance between conductor and semiconductor element. The point of the conductor is accurately polished, which can sometimes take days, until the contact resistance on a calibration sample reaches a predetermined value. Even after the time-consuming calibration of the points of the conductors the deviation in the contact resistance results in inaccuracies in the measurements.

Additionally, another problem is that the scaling of IC dimensions to the submicron region requires resolution and sensitivity beyond that achievable with the standard SRP technique. Accordingly, a measuring technique with greater sensitivity, dynamic range, and in-depth and lateral resolutions is required.

SUMMARY OF THE INVENTION

The present invention has for its object to provide a new method wherein the accuracy of resistance measurements on a semiconductor element is considerably improved.

For this purpose the invention provides a method for measuring the resistance or conductivity between two or more conductors which are placed against a semiconductor element, wherein in order to bring the contact resistance between the conductors and the element to and hold it at a predetermined value during measuring, the conductors are held at a constant distance and/or under constant pressure relative to the semiconductor element. In the invention claimed in the parent application, the method comprised placing conductors on the top surface of the semiconductor element. The invention claimed herein is directed to placing one conductor on the top surface of the semiconductor element and a second conductor on the bottom surface.

In order to achieve increased sensitivity, dynamic range, and in-depth and lateral resolution the inventive method employs a scanning proximity microscope, such as an AFM (Atomic Force Microscope), to adjust the contact pressure between the top conductor and the top surface. Because of such a scanning proximity microscope the present inventive method has been designated nano-SRP.

BRIEF DESCRIPTION OF THE DRAWINGS

Further details, features and advantages of the present invention will become apparent in the light of the following description of a preferred embodiment according to the present invention with reference to the annexed drawings, in which.

DETAILED DESCRIPTION

Figure 1:
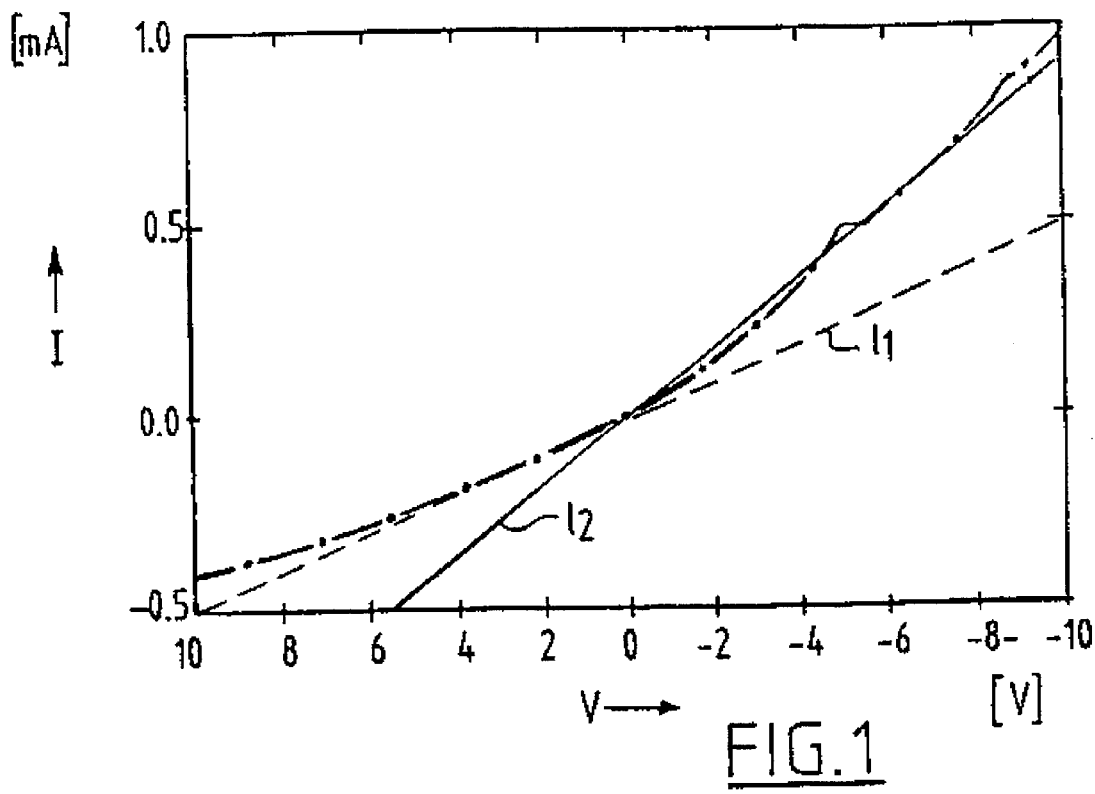
FIG. 1 shows a graph of a current-voltage characteristic measured on a first semiconductor element and according to a first preferred method according to the present invention.
Figure 2:
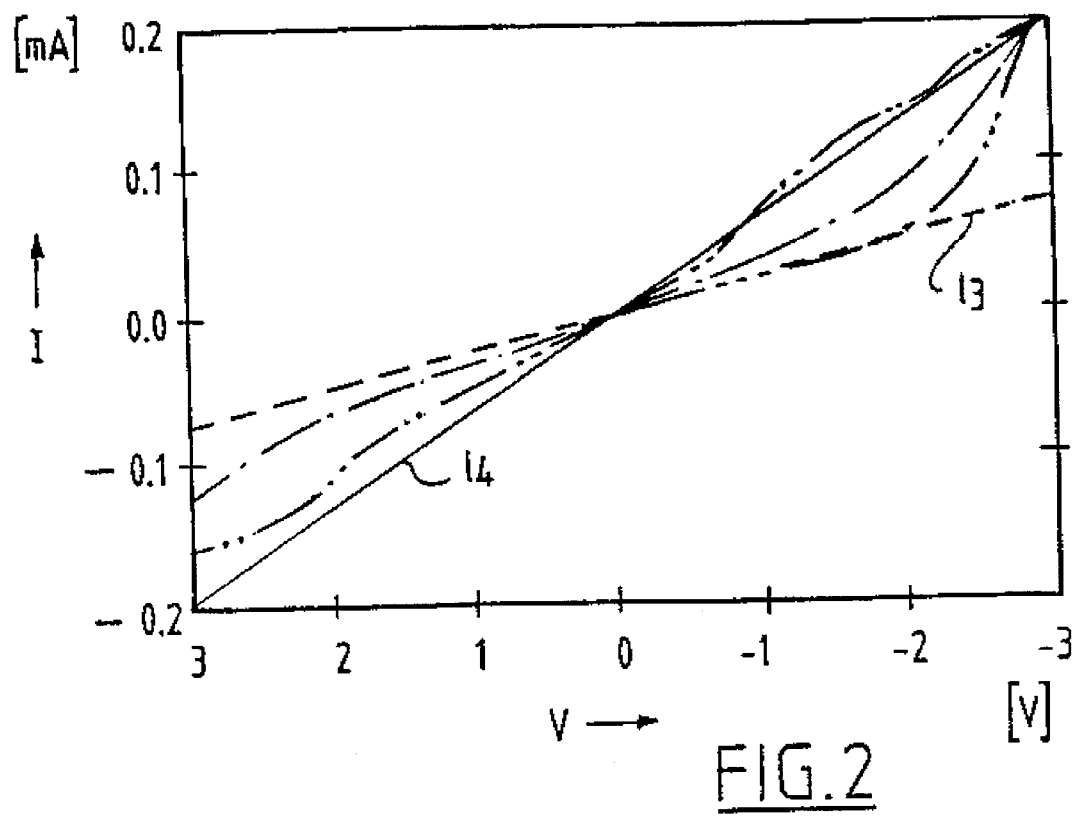
FIG. 2 shows a graph of a current-voltage characteristic measured on a second semiconductor element and according to a second preferred method according to the present invention.

FIGS. 1 and 2 are measured using an AFM arrangement (Atomic Force Microscopy). Herein a semiconductor element is movable three-dimensionally with piezo-crystals, a first of which adjusts the pressure or distance of a conducting needle relative to the semiconductor element, while two others enable a movement over the surface of the semiconductor element. A laser beam is directed onto the contact point of the conductor and the semiconductor element. The reflection of the laser beam is picked up by a photodiode, and the output of the photodiode is fed back to the first mentioned piezo-crystal.

In the measured graphs use is made of a tungsten wire of 20 µm diameter which is cut to a point by electrochemical etching. The curve of FIG. 1 is measured on a semiconductor element with a relatively high resistivity, $\rho \approx 4.7\,\Omega\cdot\text{cm}$. Applying a force of constant value between the conductor and the semiconductor element results in a current-voltage characteristic $1_1$ at negative voltage and $1_2$ at positive voltage.

FIG. 2 shows measurements on a substrate with a comparatively smaller resistivity $\rho \approx 0.0084\ \Omega\cdot\text{cm}$. Different measurements are indicated with different curves in FIG. 2 and show an approximately linear relation ($1_3$ and $1_4$), wherein the angles of the lines ($1_3$ and $1_4$) are dependent on the applied pressure between conductor and semiconductor element.

By applying the pressure between the semiconductor element and the conductor, this conductor penetrates through a thin oxide layer which in practice is almost always present on the semiconductor element. The pressure can be held very constant because of feedback to the first mentioned piezo-crystal. Using the two above mentioned piezo-crystals the conductors are moved over the surface for measuring the resistance or conductivity along the surface, wherewith the resistance at different depths in the semiconductor element becomes known.

Another technique which makes use in accurate manner of the control of movement of a conductor over a semiconducting element, for instance, is so-called Scanning Tunneling Microscopy (STM), wherein use is made of the tunnel flow between the conductor and the semiconductive element for holding the conductor at constant distance relative to the surface of that element. The oxide layer over the semiconductor element can form a problem here.

An important feature of the method according to the present invention relates to the possibility of measuring either with DC current and/or voltage, or AC voltage or current.

Good results have been obtained by measuring with AC voltage and using a DC bias voltage.

Alternatively, in lieu of employing conductors on the surface of the semiconductor element, a single conducting tip may be used on the top surface and the other electrical contact to close the measurement circuit established through a large back contact, i.e., a contact on the bottom surface of the semiconductor element. Other than the use of a single tip on the surface and a back contact, operation of this embodiment is essentially the same as in the embodiment discussed above. Advantageously, the back contacts may be made by ultrasound soldering. A soldering alloy consisting of 44% In, 42% SN and 14% Cd (melting point 93° C.) may be used to reduce the heating of the semiconductor element while producing a high quality Ohmic contacts without the need for preliminary etching.

While the tungsten wire tip discussed above (and other metal tips, such as electrochemically etched Pt-Ir wires), may be successfully used as the single conducting tip, a rather high force (N 100 μN) is required to make a good electrical contact. Under these high forces, the metal tips are not sufficiently rigid and they deform rather quickly. A more stable conducting tip may be provided by a commercial tip based on boron implanted diamond from Adamant Kogyo Co., Tokoyo.

Figure 3:
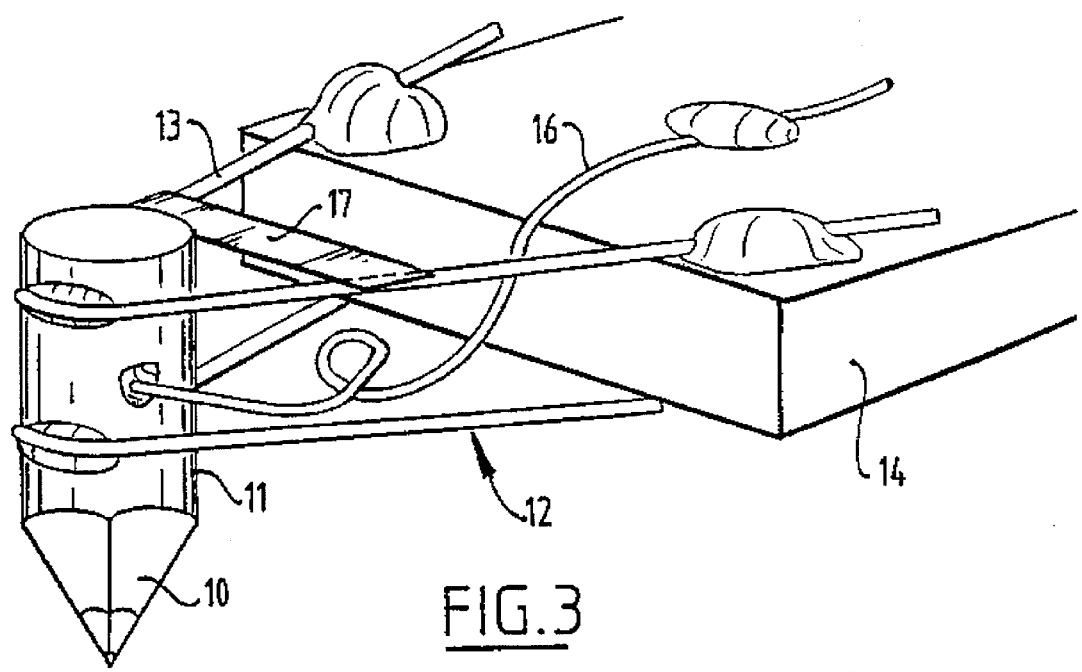
FIG. 3 is a schematic diagram of a conductive AFM tip employing implanted diamond which is incorporated into a cantilever.

Referring to FIG. 3, before the tip 10 is ion implanted, it is ground to the shape of a three-sided pyramid whose point is sharpened to a radius of less than 100 nm. The apex angle is 60° or 80°. The diamond tip 10 is brazed to a Ti cylinder 11 of 2 mm in height and 0.5 mm in diameter. The cylinder 11 is shortened as much as possible in order to decrease its weight. The conditions of the boron implant are as follows: 80 Kev, $1.18 \cdot 10^{16}$ ions/cm$^2$, 150 μA. The diamond tip 10 has the advantage of being very sharp (the tip radius is smaller than 100 nm) and extremely hard so that it can withstand the necessary high pressures.

The tip 10 is incorporated into a cantilever 12 which may advantageously be formed by a set of four Pt wires 13 with a diameter of 50, 25 or 10 μm, mounted on a glass support 14 which fits into a conventional scanning proximity microscope, such as the Nanoscope II AFM (Digital Instruments, Inc., Santa Barbara, Calif.). A Topometrix nanoscope may also be advantageously employed. The electrical connection is ensured by an extra curly Au wire 16 to avoid the complication of thermal expansion caused by Joule heating. A Pt mirror 17 shields the sample from illumination by the laser beam that is used to detect the cantilever deflections. The construction, shown in FIG. 3, leads to a force constant of 200 N/m, and a weight of 0.45 mg.

As should be appreciated, the above-described embodiment is but one example of a suitable arrangement for carrying out the invention.

Examples of use of the invention follow.

Figure 4:
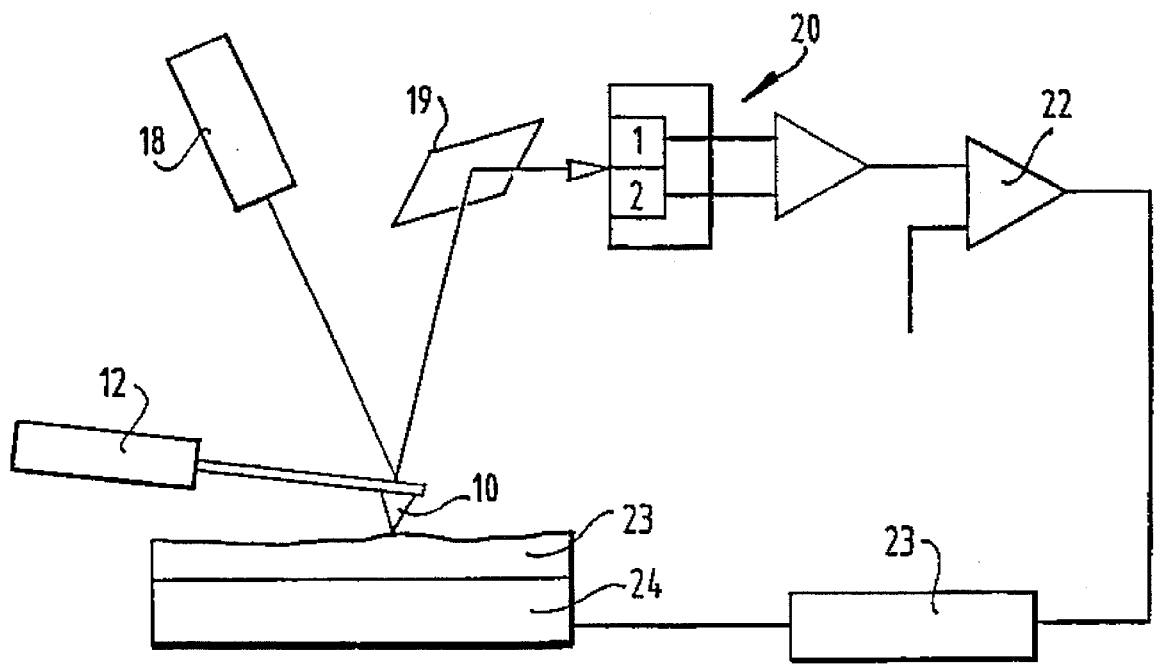
FIG. 4 is a schematic diagram of an Atomic Force Microscope (AFM) which may be used in carrying out the invention.

The cantilever 12 is incorporated in a conventional AFM, as shown in FIG. 4. Light from laser 18 is focussed on the cantilever 12 and after being reflected from the cantilever is directed by a mirror 19 toward a photo-detector 20 which includes a double photodiode 21. The photodiode 21 senses the position of the reflected beam and, hence, the deflection of the cantilever 12 by sensing the relative light intensity on the two sensitive parts. Deflection of the cantilever 12 may also be controlled by a sensor (not shown) which is disposed in a fixed position adjacent to the tip 10. In operation, a feedback loop, which includes a comparator 22 and a integrator 23, keeps the position of the reflected beam, and hence, the force on the semiconductor test sample 23, constant. This is accomplished by moving the sample 23 up and down with the z axis of the xyz piezo translator 24 as the sample is scanned underneath in the x and y direction.

In one application, silicon samples 23 were used which were homogeneously doped within the resistivity range of 0.01 Ω-cm –40 Ω-cm. B-doped (p-type) as well as P-doped (n-type) samples were used. All samples 23 were polished on their (100) side SRP.I-V curves as a function of load were collected by increasing the force on the tip 10 from 50 μN to 260 μN by changing the AFM feedback setpoint voltage.

Figure 5:
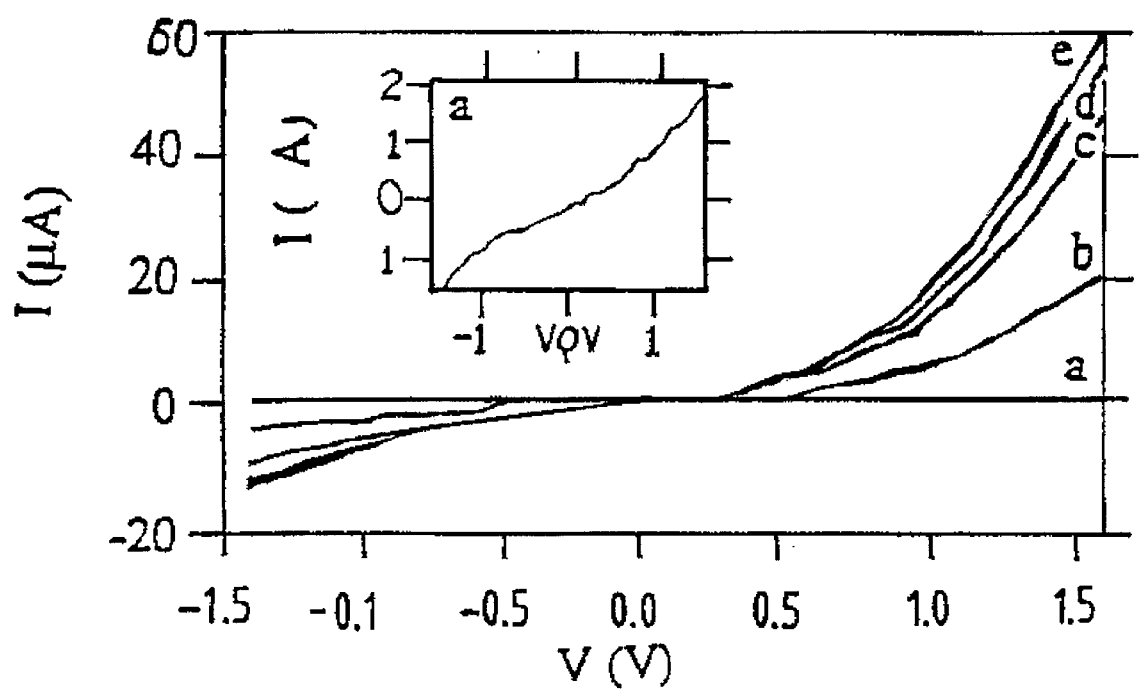
FIG. 5 shows variation of the current-voltage curves with load for a diamond tip on (100) (n-type silicon)
Figure 6A:
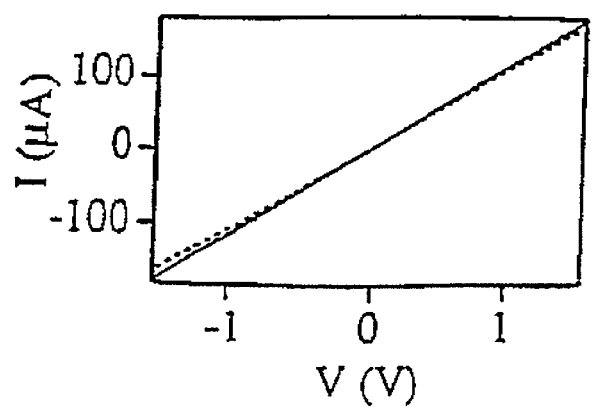
FIG. 6 shows variation of current-voltage curves with resistivity at a load of 200 µN.
Figure 6B:
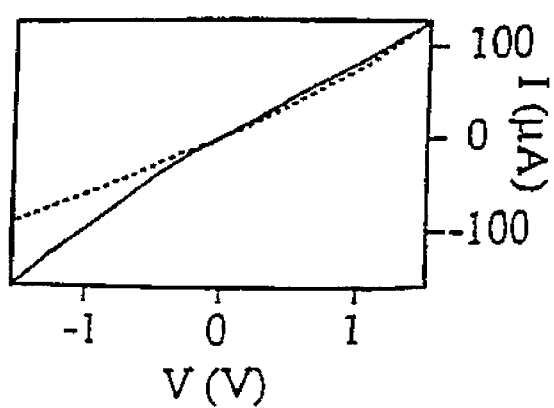
Figure 6C:
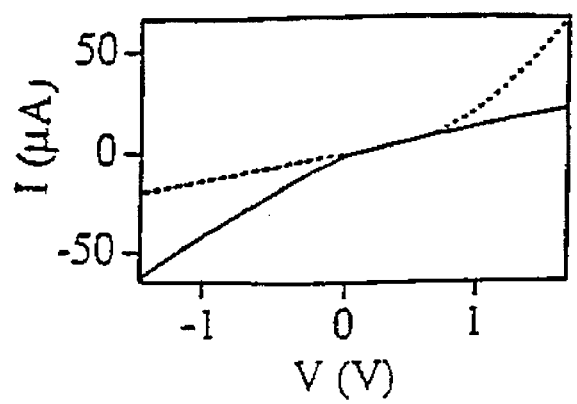
Figure 6D:
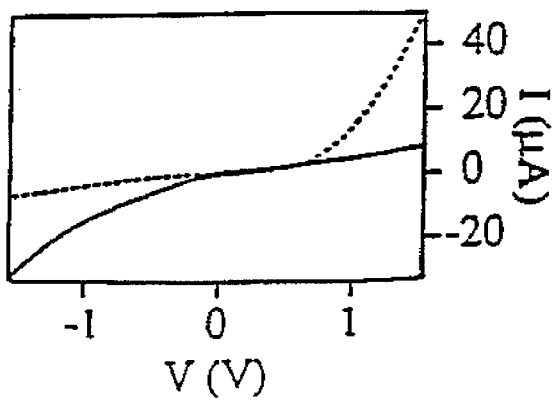
Figure 6E:
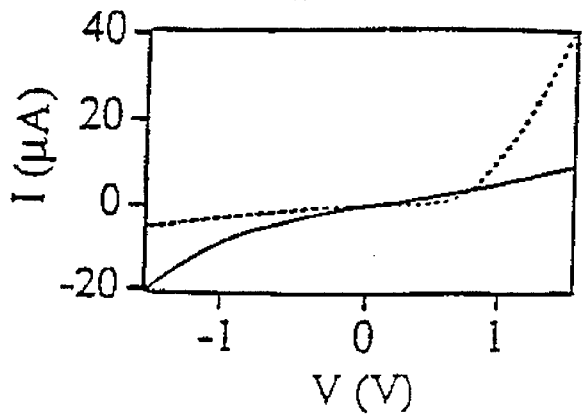
Figure 6F:
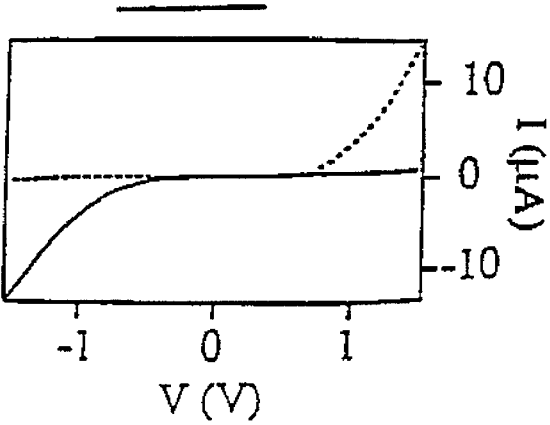

The variation with load of the current-voltage curves for an n-type (100) Si sample 23, with resistivity 1.03 Ω-cm, are shown in FIG. 5. The loads are (a) 50 μN, (b) 70 μN, (c) 140 μN, (d) 200 μN, and (e) 260 μN. The insert shows the tunneling behavior at 50 μN (note the change in scale to nA). The force-dependent behavior of these curves is representative for the measurements on all samples 23. When the force is increased from 50 μN (curve a) to 70 μN (curve b) the contact suddenly changes from nearly isolating to conducting behavior. The shape of the I-V curves indicates pure tunneling (see insert in FIG. 5) below 70 μN. Above 70 μN all the I-V curves are nearly identical except for a scaling factor which increases proportionally with the square root of the working load. The same transition-force and scaling behavior was observed during I-V measurements on Pt samples with the same diamond tip. In this case, the measurements showed ohmic I-V curves for the high loads, below the transition force only tunneling was observed. The origin of the tunneling behavior and the transition load is probably related with the presence of native oxide or contamination on the tip and the sample. Above a certain load the tip pushes partially through this layer, and a behavior which is specific and reproduceable for the sample under investigation appears. Below this load the I-V curve is dominated by the tunneling through the contamination layer and only weakly dependent on the underlying sample conductivity.

FIG. 6 represents I-V curves for samples 23 with varying resistivities at a constant load of 200 μN. The n-type curves are represented by dotted lines; the p-type curves by full lines. The resistivities for n-and p-type silicon are respectively given by: (a) 0.008 and 0.01 Ω-cm, (b) 0.082 and 0.1

Ω-cm, (c) 1.03 and 1.03 Ω-cm, (d) 6.0 and 4.8 Ω-cm, (e) 9.3 and 10.4 Ω-cm, (f) 42.0 and 23.4 Ω-cm. At the high load of the 200 μN, there is an evolution in the I-V curves with increasing resistivity from data showing nearly ohmic behavior to a typical rectifying contact. All curves clearly reflect the type of the silicon. Assuming that the contact is ohmic and the contact acts like a circular contact, the spreading resistance equation defines the ideal relation between the resistivity of the material and the measured resistance of the point contact.

$$R = \rho/4 \cdot \sqrt{\pi}/A \tag{1}$$

where R is the measured spreading resistance, ρ is the resistivity of the material and A is the contact area.

It should be noted that formula (1) is only applicable if the contact area is circular. Additionally, formula (1) cannot be used for the non-ohmic contact between a diamond tip and silicon. Accordingly, a calibration curve, which is a plot of the measured spreading resistance versus resistivity, is required.

Figure 7:
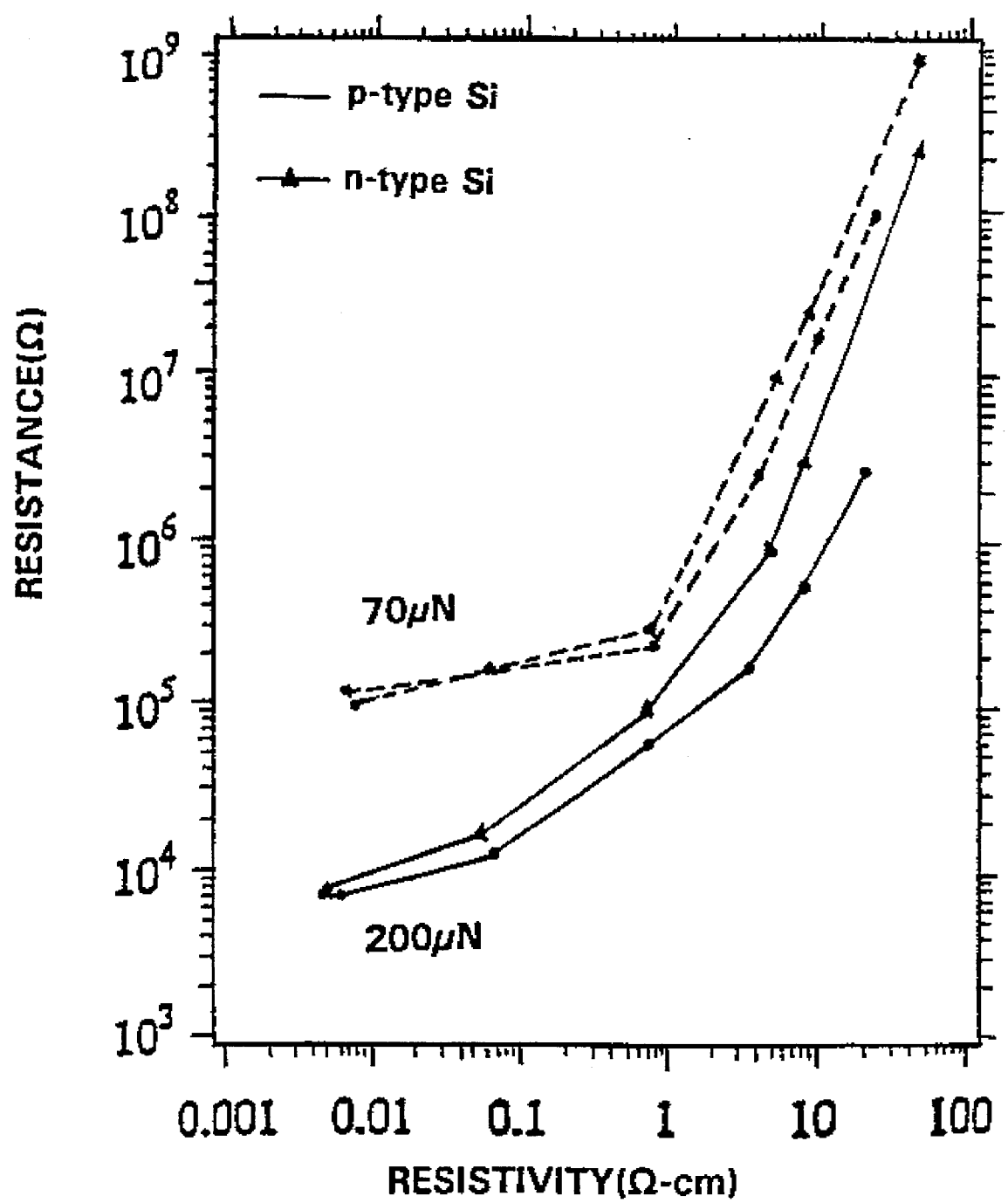
FIG. 7 represents calibration curves showing the variation of measured resistance on homogeneously doped silicon samples with the resistivity at a load of 200 µN (full lines) and 70 µN (dashed lines) using a non-coated diamond tip.

FIG. 7 represents the calibration curves for a non-coated diamond tip on n-type and p-type silicon at working loads of 200 μN and 70 μN. The curves are flattened in the region of the lower resistivities, pointing to a series resistance on account of the diamond that is probably not sufficiently conductive. As a consequence the dynamic range of this tip is limited to resistivity values higher than 0.1 Ω-cm (or $2 \cdot 10^{17}/cm^3$ for p-type and $9 \cdot 10^{16}/cm^3$ for n-type silicon).

Figure 8:
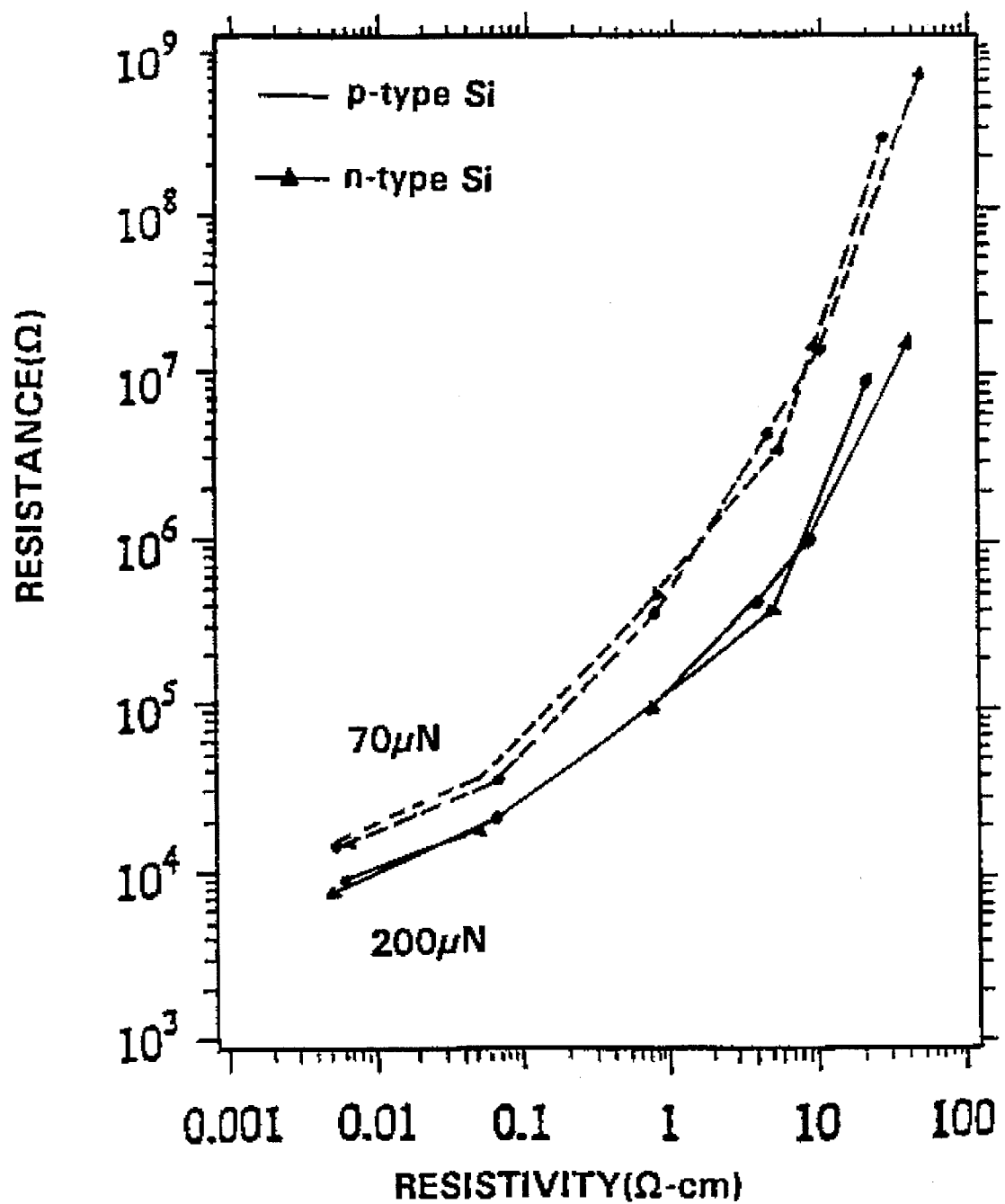
FIG. 8 shows calibration curves for a W-coated diamond tip at working loads of 200 µN (full lines) and 70 µN (dashed lines)

Upon decreasing the working load, the dynamic range shrinks even more. Therefore, some of the diamond tips were coated by sputtering with a thin layer of tungsten (35 nm). FIG. 8 shows the calibration curves obtained with a coated tip.

Several conclusions can be drawn from a comparison of FIGS. 7 and 8. Firstly, at a working load of 200 μN the dynamic range for the coated tip is extended to 0.01 Ω-cm at least. The resistance measured between the coated tip and a platinum sample for a comparable size of AFM imprints was 2.5 kΩ. Hence, based on the extrapolation of the calibration curves, it is concluded that the dynamic range ends at resistivities a little below 0.01 Ω-cm. Secondly, the n-type and p-type calibration curves come closer to each other. Finally, it is noted that the calibration curves for the coated tip keep a high dynamic range and a nicely monotonic behavior at lower loads (70 μN). Hence, these tips can be used at lower loads which implies a reduced imprint and contact area.

The data in FIGS. 7 and 8 show a clear monotonic behavior indicating that it is possible to convert measured resistance values using nano-SRP into carrier concentrations. Hence, these calibration curves allow construction of a one- or two-dimensional carrier concentration map out of a resistance map measured on a cross section of a device.

Once the behavior of the nano-SRP setup with a tungsten-coated diamond tip on bulk samples is established, the next step is the in-depth profiling on non homogeneous structures in order to determine the distribution of the electrically active carriers. Two samples were used: the first one is a $p^+n$ junction formed by a boron implantation at 20 keV for $2 \cdot 10^{15}/cm^2$ on a (100) n-type silicon wafer, the second one is a $p^+p$ profile formed by a boron implantation at 40 keV for $4 \cdot 10^{15}/cm^2$ on a (100) p-type silicon wafer. Both samples were annealed at 900° C. for 30 minutes. A cross-section was obtained by cleaving the samples. The cleavage plane was polished using different grid size abrasive paper and finally colloidal silica (0.03 μm size) to obtain an atomically flat silicon surface. After polishing, the samples were cleaned using solvents to eliminate contaminants and finally rinsed in deionized water to dissolve all the residual solvents. Ultrasound soldering was used to make Ohmic back-contacts on a second cleavage plane, intersecting both the n-type and p-type region.

For the nano-SRP the applied pressures are higher than in standard AFM operation. This implies that there is a serious chance of damaging the surface (and the tip) if the tip were scanned with the full pressure applied that is required to make a resistance measurement. Therefore, the tip is moved under reduced pressure (40 μN) whereby after each step the pressure is again increased to the measurement level and the resistance measurement is performed. In order to reach a 50 nm resolution a 50 nm stepsize was chosen.

In order to compare the measured profile with a standard SRP profile, it is necessary to define the zero position; i.e., the sample surface edge. Indeed, when stepping across this edge the current will not disappear abruptly but will continue to flow through the sides of the conducting tip. Simultaneous standard AFM imaging of this area is required to determine the zero position exactly. Another elegant way to observe the zero-position is to use an oxide layer on top of the layered structure. The resistance measured by the tip will become very large when the oxide/silicon interface is reached.

The collected raw resistance data are smoothed with the constrained cubic-splines method presented by Clarysse and Vandervorst (T. Clarysse and W. Vandervorst, Solid State El. 31,53 (1988)) and converted to resistivities using the calibration curves reported in FIG. 8 (a working load of 70 μN was chosen for the $p^+p$ sample, 200 μN for the $p^+p$ sample and 40 μN while moving from one measuring site to the next). From the resistivity profile a carrier concentration profile can be obtained by straightforward application of the relation:

$$n = \frac{1}{e \cdot \rho \cdot \mu(N)} \tag{2}$$

where μ is the mobility factor and N is the atomic dopant density.

However, it should be noted that when the tip is in contact with a lowly doped part of the sample it is quite possible that the current will follow a less resistive path through a more highly doped part of the sample thereby influencing the measured resistance. If this occurs, a deconvolution step using a three-dimensional calculation will be required.

Figure 9:
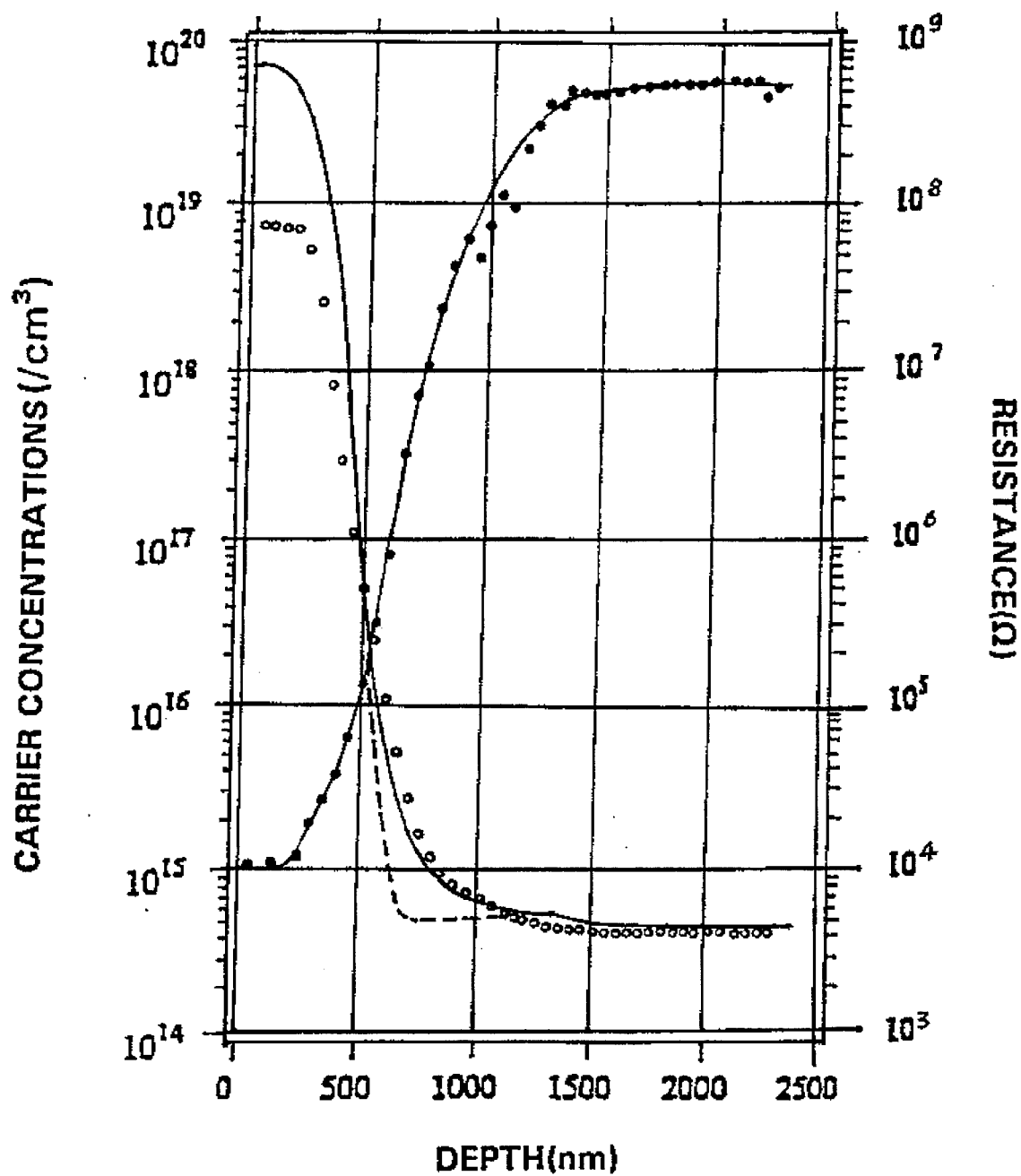
FIG. 9 shows a $p^+p$ profile measured with nano-SRP.

FIG. 9 shows the measured resistance and the calculated carrier concentration for the $p^+p$ sample at a load of 70 μN. The filled circles represent the raw resistance data, the full line the smoothed resistance data, the open circles the calculated carrier profile. The results from standard-SRP are also given: the on-bevel profile is given by the dashed line, the reconstructed vertical in-depth profile by the full line. It is important to note that the standard-SRP and nano-SRP profile are not directly comparable. This is related to the phenomenon for carrier spilling; i.e., the redistribution of the mobile carriers away from the steep dopant distributions. Using specialized Poisson software it is possible to extract from the standard-SRP on-bevel carrier profile the corresponding in-depth (cross-sectional) profile. The latter profile corresponds very well with the nano-SRP profile, as shown in FIG. 9. As expected from the calibration curves we see on a saturation level in the carrier profile for high concentrations ($8 \cdot 10^{18}/cm^3$).

Figure 10:
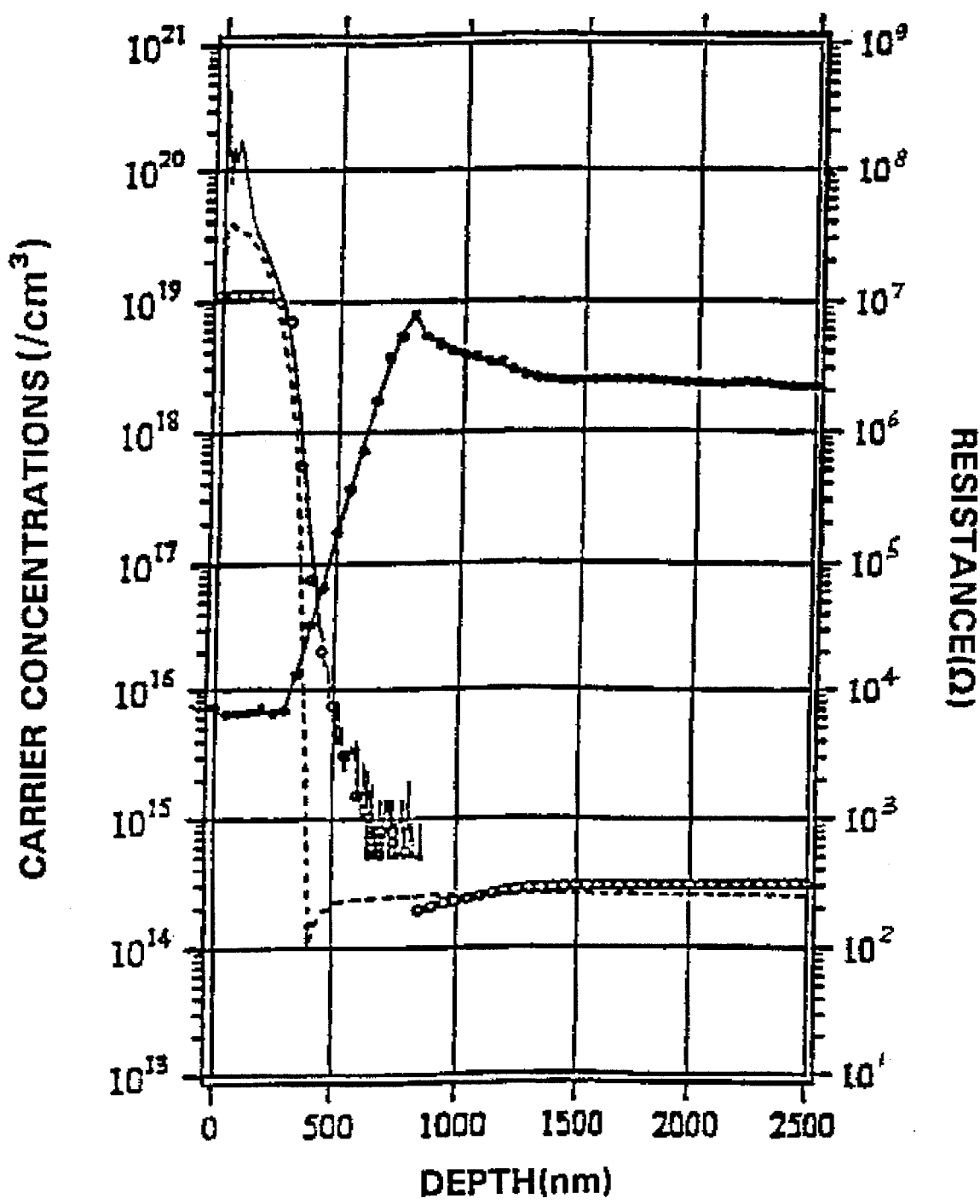
FIG. 10 shows a $p^+n$ profile measured with nano-SRP.

FIG. 10 shows the measured resistance and the calculated carrier concentrations for the $p^+n$ sample at a load of 200 μN. The filled circles represent the raw resistance data, the full line the smoothed resistance data, the open circles the calculated carrier profile. Also given are the carrier profile from standard-SRP (dashed line) and the dopant profile from SIMS (dotted line). It is important to note the difference in junction depth measured by the three techniques: 410 nm for SRP, 570 nm for SIMS and 800 nm for nano-SRP. As shown in FIG. 10 the nano-SRP profile has a close resemblance to the standard-SRP and SIMS measurements, except for the differences in junction depths. The shallow depth for the standard-SRP as compared to SIMS is due to the well known phenomenon for carrier spilling taking into account the bevel geometry. As one removes more and more material as one goes further along the bevel the highly doped top layer becomes thinner. At a certain depth the doped top layer becomes so small that reverse carrier spilling from the substrate dominates the junction position, hence leading to a forward shift of its depth. Although in nano-SRP no bevel is applied, one still has to consider effects of carrier diffusion. Indeed, while SIMS measures the "immobile" dopant atoms, nano-SRP measures the "mobile" carrier distribution. For structures with relatively steep dopant gradients, these carriers will redistribute in order to reduce this gradient leading in our case to a displacement of the junction depth (i.e., the position where the intrinsic carrier concentration is reached) to a larger depth. The magnitude of this displacement is in agreement with simulations involving the Poisson equations for the assumed dopant profile. Finally, it is worth noting that the difference between the concentration peaks measured by SRP and SIMS can be attributed to poor electrical activation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of measuring resistance or conductivity of a semiconductor element of a particular type having a top surface and a bottom surface, comprising the steps of:

(a) placing at least a first conductor in contact with said top surface;

(b) placing a second conductor in contact with the bottom surface;

(c) adjusting the contact pressure between the first conductor and the top surface using a scanning proximity microscope until a substantial current increase is measured between the first and second conductors;

(d) measuring resistance or conductivity between said first and second conductors after step (c);

(e) changing the position of said first conductor; and (f) repeating step (d) while maintaining the contact pressure at the value achieved in step (c).

2. A method as claimed in claim 1, wherein the scanning proximity microscope is an AFM (Atomic Force Microscope).

3. A method as claimed in claim 1, wherein the scanning proximity microscope is an STM (Scanning Tunneling Microscope).

4. A method as claimed in claim 1, wherein the first conductor includes a diamond tip.

5. A method as claimed in claim 4, wherein the diamond tip is implanted with boron.

6. A method as claimed in claim 5, wherein the diamond tip is coated with tungsten.

7. A method as claimed in claim 1, wherein the second conductor is fixed to the bottom surface.

8. A method as claimed in claim 7, wherein the second conductor is fixed to the bottom surface by soldering.

9. A method of determining the carrier profile of a semiconductor element having a top surface and a bottom surface which comprises:

(a) measuring the resistance of a plurality of semiconductor samples having respective known resistivities;

(b) deriving a relationship of resistance versus resistivity from step (a);

(c) placing at least a first conductor in contact with the top surface of the semiconductor element whose profile is to be determined;

(d) placing a second conductor in contact with the bottom surface of said semiconductor element;

(e) adjusting the contact pressure between the first conductor and the top surface using a scanning proximity microscope until a substantial current increase is measured between the first and second conductors;

(f) measuring resistance between said first and second conductors after step (e);

(g) changing the position of said first conductor;

(h) repeating step (d) while maintaining the contact pressure at the value achieved in step (c);

(i) determining a resistivity profile for the semiconductor element from the resistance measurements made in step (f) and the relationship derived in step (b); and (j) determining a carrier profile for the semiconductor element from the resistivity profile.

10. A method as claimed in claim 9, wherein each sample has a top surface and a bottom surface and the resistance of each sample is measured in step (a) by:

(a1) placing at least a third conductor in contact with the top surface of the sample;

(a2) placing a fourth conductor in contact with the bottom surface of the sample;

(a3) adjusting the contact pressure between the third conductor and the top surface using a scanning proximity microscope until a substantial current increase is measured between the first and second conductors; and (a4) measuring resistance between said third and fourth conductors after step (a3).

11. A method as claimed in claim 10, wherein the scanning proximity microscope used in step (a3) and step (e) is an AFM (Atomic Force Microscope).

12. A method as claimed in claim 10, wherein the scanning proximity microscope is an STM (Scanning Tunneling Microscope).

13. A method as claimed in claim 10, wherein the first conductor includes a diamond tip.

14. A method as claimed in claim 13, wherein the diamond tip of the first conductor is implanted with boron.

15. A method as claimed in claim 14, wherein the diamond tip of the first conductor is coated with tungsten.

16. A method as claimed is claim 15, wherein the third conductor includes a diamond tip.

17. A method as claimed in claim 16, wherein the diamond tip of the third conductor is implanted with boron.

18. A method as claimed in claim 17, wherein the diamond tip of the third conductor is coated with tungsten.

19. A method as claimed in claim 10, wherein the second conductor is fixed to the bottom surface of the semiconductor element.

20. A method as claimed in claim 19, wherein the second conductor is fixed to the bottom surface by soldering.

21. A method as claimed in claim 20, wherein the fourth conductor is fixed to the bottom surface of the sample.

22. A method as claimed in claim 21, wherein the fourth conductor is fixed to the bottom surface by soldering.

23. A method of determining the carrier profile of a semiconductor element having a top surface and a bottom surface which comprises:

(a) measuring the resistance of a plurality of semiconductor samples having respective known resistivities;

(b) deriving a relationship of resistance versus resistivity from step (a);

(c) placing a first conductor in contact with the top surface of the semiconductor element whose profile is to be determined;

(d) placing a second conductor in contact with the top surface of said semiconductor element;

(e) adjusting the contact pressure between the first and second conductors and the top surface using a scanning proximity microscope until a substantial current increase is measured between the first and second conductors;

(f) measuring resistance between said first and second conductors after step (e);

(g) changing the position of said first conductor;

(h) repeating step (d) while maintaining the contact pressure at the value achieved in step (c);

(i) determining a resistivity profile for the semiconductor element from the resistance measurements made in step (f) and the relationship derived in step (b); and (j) determining a carrier profile for the semiconductor element from the resistivity profile.

24. A method as claimed in claim 23, wherein the scanning proximity microscope used in step (a3) and step (e) is an AFM (Atomic Force Microscope).

25. A method as claimed in claim 23, wherein the scanning proximity microscope is an STM (Scanning Tunneling Microscope).

26. A method as claimed in claim 23, wherein the first conductor includes a diamond tip.

27. A method as claimed in claim 26, wherein the diamond tip of the first conductor is implanted with boron.

28. A method as claimed in claim 27, wherein the diamond tip of the first conductor is coated with tungsten.

29. A method as claimed is claim 28, wherein the second conductor includes a diamond tip.

30. A method as claimed in claim 29, wherein the diamond tip of the second conductor is implanted with boron.

31. A method as claimed in claim 30, wherein the diamond tip of the second conductor is coated with tungsten.

* * * * *